United States Patent
Lu et al.

(10) Patent No.: US 10,342,348 B2
(45) Date of Patent: Jul. 9, 2019

(54) STRUCTURAL COLUMN FOR A SERVER RACK

(71) Applicant: HONGFUJIN PRECISION ELECTRONICS (TIANJIN) CO., LTD., Tianjin (CN)

(72) Inventors: Hsueh-Chin Lu, New Taipei (TW); Kuo-Chih Hung, New Taipei (TW); Hung-Liang Chung, New Taipei (TW); Ti-An Tsai, New Taipei (TW)

(73) Assignee: HONGFUJIN PRECISION ELECTRONICS (TIANJIN) CO., LTD., Tianjin (CN)

( * ) Notice: Subject to any disclaimer, the term of this patent is extended or adjusted under 35 U.S.C. 154(b) by 188 days.

(21) Appl. No.: 15/399,990

(22) Filed: Jan. 6, 2017

(65) Prior Publication Data
US 2018/0116400 A1    May 3, 2018

(30) Foreign Application Priority Data
Oct. 31, 2016    (CN) .......................... 2016 1 0933375

(51) Int. Cl.
| A47B 96/14 | (2006.01) |
| H05K 7/14 | (2006.01) |
| H05K 7/18 | (2006.01) |
| A47B 57/40 | (2006.01) |

(52) U.S. Cl.
CPC ...... *A47B 96/1433* (2013.01); *A47B 96/1408* (2013.01); *H05K 7/1488* (2013.01); *H05K 7/18* (2013.01); *A47B 57/40* (2013.01)

(58) Field of Classification Search
CPC ............ A47B 96/1433; A47B 96/1408; H05K 7/1488; H05K 7/18
USPC ......... 428/595, 596, 603; 361/724; 108/107, 108/109, 186, 192, 147.11, 147.12, 108/147.13, 147.14, 147.15, 147.16, 108/147.17; 312/223.2, 265.1, 265.2, 312/265.3, 265.4; 211/153, 187; 52/842, 52/843, 844, 845
See application file for complete search history.

(56) References Cited

U.S. PATENT DOCUMENTS

| 1,891,740 A | * | 12/1932 | Westerman | ............. B21C 23/14 138/165 |
| 4,069,638 A | * | 1/1978 | Hasselqvist | ........... B21C 37/104 403/231 |
| 4,238,550 A | * | 12/1980 | Burgess | ................. B21D 5/086 211/162 |
| 4,643,319 A | * | 2/1987 | Debus | ...................... H02B 1/01 211/182 |

(Continued)

FOREIGN PATENT DOCUMENTS

DE    202014102178 U1 *  8/2015  ........... A47B 47/027

*Primary Examiner* — Michael Safavi
(74) *Attorney, Agent, or Firm* — ScienBiziP, P.C.

(57) ABSTRACT

A structural column for a server includes a first bent portion, a second bent portion connected with the first bent portion, a third bent portion connected with the second bent portion, a fourth bent portion connected with the third bent portion, and a fifth bent portion connected with the fourth bent portion. The structural column is made from a single piece of flat sheet metal and the shapes of the bent portions and their respective interactions, without fasteners or other joining means, provide high strength and light weight.

16 Claims, 3 Drawing Sheets

(56) References Cited

U.S. PATENT DOCUMENTS

| | | | | |
|---|---|---|---|---|
| 5,014,487 | A * | 5/1991 | King | A47B 47/027 |
| | | | | 211/191 |
| 5,052,565 | A * | 10/1991 | Zachrei | A47B 57/38 |
| | | | | 211/182 |
| 5,202,818 | A * | 4/1993 | Betsch | H02B 1/301 |
| | | | | 211/189 |
| 5,791,115 | A * | 8/1998 | Nicolai | H02B 1/01 |
| | | | | 52/836 |
| 5,930,972 | A * | 8/1999 | Benner | H02B 1/01 |
| | | | | 211/189 |
| 6,415,576 | B1 * | 7/2002 | Stromback | E04C 3/07 |
| | | | | 428/35.8 |
| 6,428,127 | B1 * | 8/2002 | Rasmussen | A47B 47/0008 |
| | | | | 312/265.4 |
| 6,915,616 | B2 * | 7/2005 | Fontana | H02B 1/306 |
| | | | | 312/265.1 |
| 7,441,847 | B2 * | 10/2008 | Francisquini | H02B 1/01 |
| | | | | 312/265.3 |
| 8,128,183 | B2 * | 3/2012 | Shen | A47B 96/14 |
| | | | | 312/223.1 |
| 9,871,353 | B2 * | 1/2018 | Boehme | H02B 1/303 |
| 2003/0035264 | A1 * | 2/2003 | Hartel | H02B 1/565 |
| | | | | 361/678 |
| 2006/0162946 | A1 * | 7/2006 | Hartel | H02B 1/565 |
| | | | | 174/9 F |
| 2015/0282613 | A1 * | 10/2015 | Chen | A47B 55/00 |
| | | | | 211/187 |

* cited by examiner

STRUCTURAL COLUMN FOR A SERVER RACK

CROSS-REFERENCE TO RELATED APPLICATIONS

This application claims priority to Chinese Patent Application No. 201610933375.2 filed on Oct. 31, 2016 the contents of which, are incorporated by reference herein.

FIELD

The subject matter herein generally relates to a structure for a rack.

BACKGROUND

The number of servers and storage devices has substantially increased the weight of a server system. As a result, the structural strength of rack columns needs to be increased to support the increased weight of a server system.

BRIEF DESCRIPTION OF THE DRAWINGS

Implementations of the present technology will now be described, by way of example only, with reference to the attached figures.

DETAILED DESCRIPTION

Figure 1:
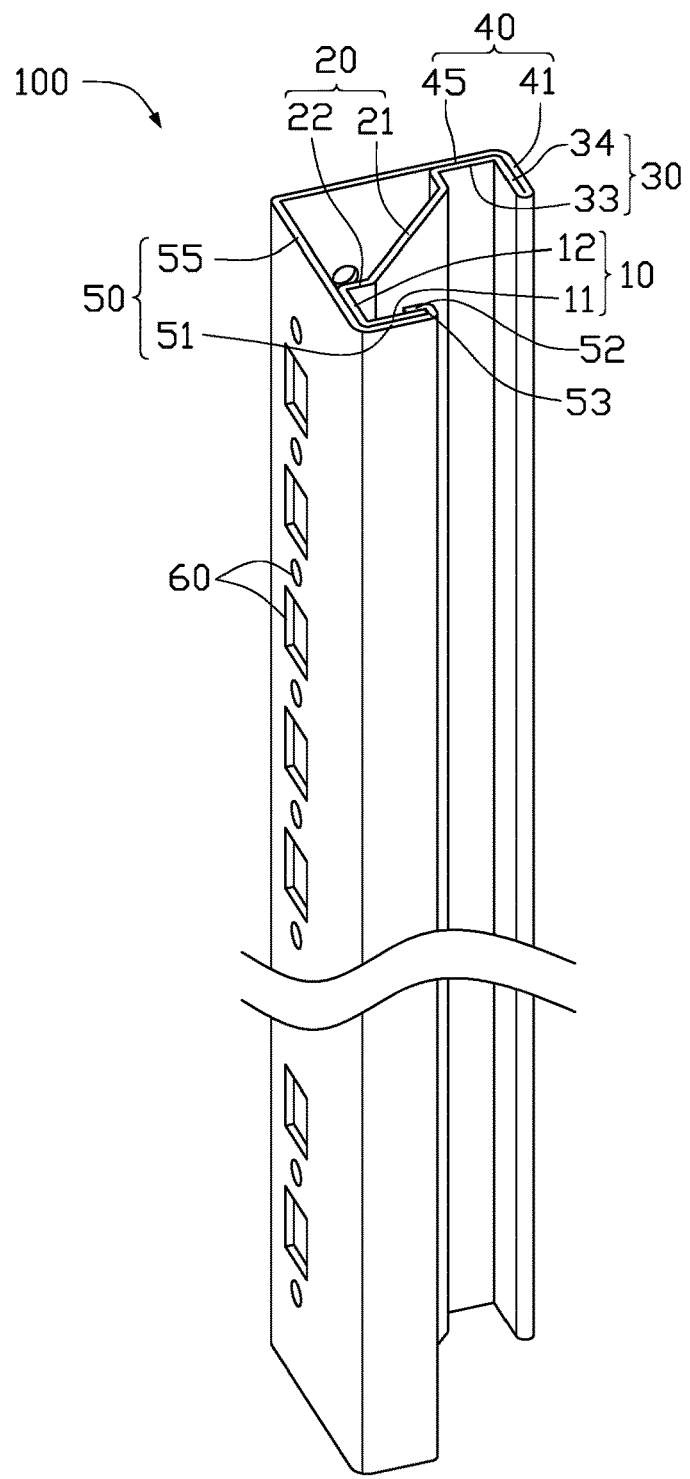
FIG. 1 is an isometric, assembled view of a first exemplary embodiment of a rack column.

It will be appreciated that for simplicity and clarity of illustration, where appropriate, reference numerals have been repeated among the different figures to indicate corresponding or analogous elements. In addition, numerous specific details are set forth in order to provide a thorough understanding of the exemplary embodiments described herein. However, it will be understood by those of ordinary skill in the art that the exemplary embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the exemplary embodiments described herein.

Several definitions that apply throughout this disclosure will now be presented.

The term "outside" refers to a region that is beyond the outermost confines of a physical object. The term "inside" indicates that at least a portion of an object is contained within a boundary formed by another object. The term "substantially" is defined to be essentially conforming to the particular dimension, shape, or other feature that the term modifies, such that the component need not be exact. For example, "substantially cylindrical" means that the object resembles a cylinder, but can have one or more deviations from a true cylinder. The term "comprising" means "including, but not necessarily limited to"; it specifically indicates open-ended inclusion or membership in a so-described combination, group, series, and the like.

Figure 2:
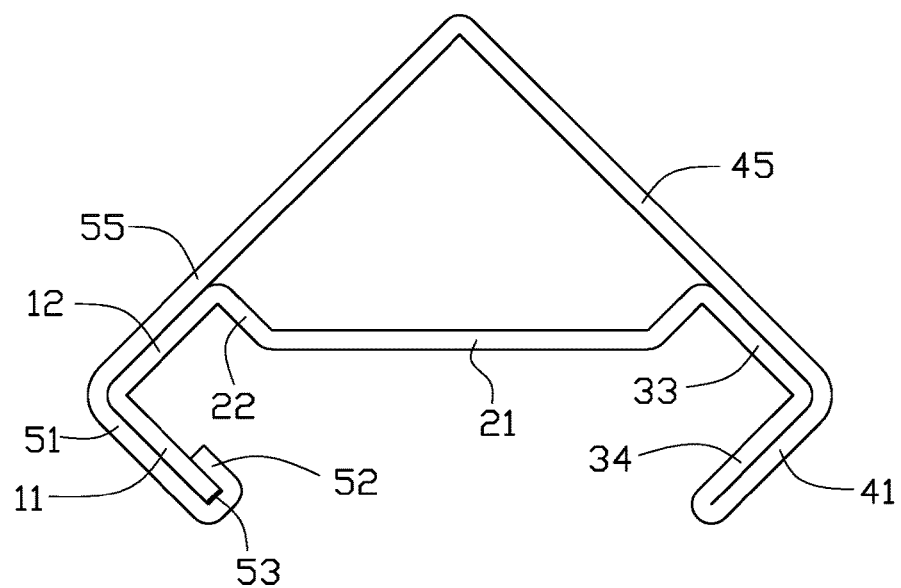
FIG. 2 is a top view of the rack column of FIG. 1.

FIGS. 1 and 2 illustrate one exemplary embodiment of a rack column 100 to support a server (not shown). The rack column 100 is formed by bending a sheet metal member.

The rack column 100 includes a first bent portion 10, a second bent portion 20 connected with the first bent portion 10, a third bent portion 30 connected with the second bent portion 20, a fourth bent portion 40 connected with the third bent portion 30, and a fifth bent portion 50 connected with the fourth bent portion 40.

The first bent portion 10 includes a first fold 11 and a second fold 12 perpendicularly connected with the first fold 11. The second bent portion 20 includes a positioning plate 21 and two limiting plates 22 respectively connected with the ends of the positioning plate 21. The angle between each limiting plate 22 and the positioning plate 21 is obtuse. One of the limiting plates 22 is perpendicularly connected with the second fold 12. The third bent portion 30 includes a third fold 33 and a fourth fold 34 perpendicularly connected with the third fold 33. The third fold is perpendicularly connected with the other limiting plate 22.

The fourth bent portion 40 includes a connecting plate 41 and a first supporting plate 45 perpendicularly connected with the connecting plate 41. One end of the connecting plate 41 is bent through 180° to connect with the fourth fold 34 and abuts on the outside of the fourth fold 34. One end of the first supporting plate 45 close to the connecting plate 41 is abutted against the outside of the third fold 33.

The fifth bent portion 50 includes a latch plate 51 and a second supporting plate 55 perpendicularly connected with the latch plate 51. One end of the second supporting plate 55 is perpendicularly connected with the first supporting plate 45, and the other end of the second supporting plate 55 is perpendicularly connected with one end of the latch plate 51. One end of the second supporting plate 55 close to the latch plate 51 is abutted against the outside of the second fold 12. The first supporting plate 45 and the second supporting plate 55 define a plurality of securing holes 60 to conveniently assemble other accessories.

The other end of the latch plate 51 extends and bends around the first fold 11 to form a hook 52. A groove 53 is formed between the latch plate 51 and the hook 52. The latch plate 51 and the hook 52 each abut a side of the first fold 11, and the first fold 11 is inserted into the groove 53.

Figure 3:
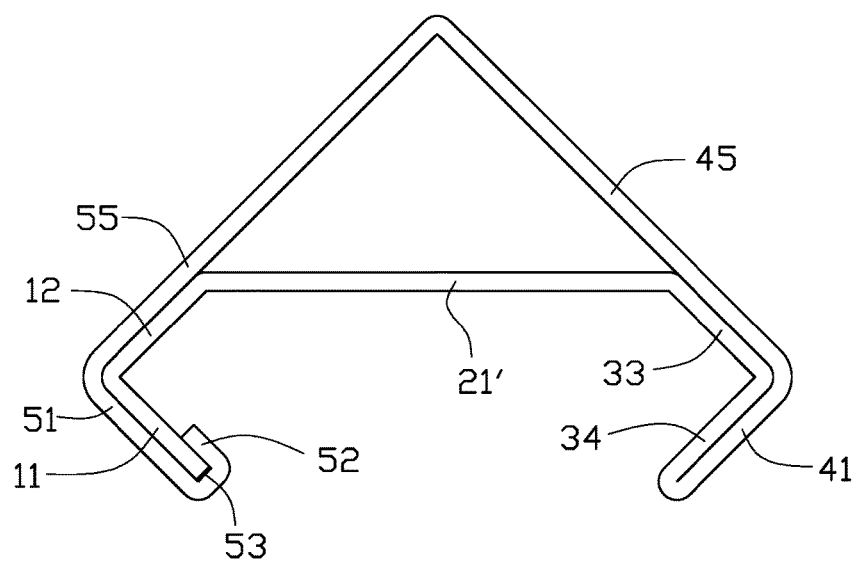
FIG. 3 is a top view of a second exemplary embodiment of the rack column of FIG. 1.

FIG. 3 illustrates another exemplary embodiment of a rack column 100. The second bent portion 20 includes only a positioning plate 21'. The sides of the positioning plate 21' are connected with the second fold 12 and the third fold 33. The angle between the positioning plate 21' and the second fold 12 is obtuse. The angle between the positioning plate 21' and the third fold 33 is obtuse.

In the above-described embodiment, the length of the first fold 11 is approximately equal to or slightly less than the length of the latch plate 51. The length of the fourth fold 34 is approximately equal to or slightly less than the length of the connecting plate 41. The length of the remaining portions of the first bent portion 10, the second bent portion 20, the third bent portion 30, the fourth bent portion 40, and the fifth bent portion 50 are determined according to need.

The exemplary embodiments shown and described above are only examples. Many details are often found in the art such as the other features of a rack column. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including the full extent established by the broad general meaning of the terms used in the claims. It will therefore be appreciated that the exemplary embodiments described above may be modified within the scope of the claims.

What is claimed is:

1. A rack column, comprising:
a first bent portion comprising a first fold;
a second bent portion connected with the first bent portion;
a third bent portion connected with the second bent portion;
a fourth bent portion connected with the third bent portion; and
a fifth bent portion connected with the fourth bent portion, the fifth bent portion comprising a latch plate;
wherein one end of the latch plate extends and bends around the first fold to form a hook, a groove is formed between the latch plate and the hook, the first fold is inserted into the groove and abuts against the latch plate and the hook; the first bent portion further comprises a second fold perpendicularly connected with the first fold, and the second bent portion is connected with the second fold; the second bent portion comprises a positioning plate and a limiting plate connected with one end of the positioning plate, the limiting plate is perpendicularly connected with the second fold; an angle between the positioning plate and the limiting plate is an obtuse angle.

2. The rack column of claim 1, wherein the third bent portion comprises a third fold and a fourth fold perpendicularly connected with the third fold, the second bent portion further comprises another limiting plate connected with one end of the positioning plate, the third fold is perpendicularly connected with the limiting plate, and the fourth fold is connected with the fourth bent portion.

3. The rack column of claim 2, wherein the fourth bent portion comprises a connecting plate, one end of the connecting plate is connected with the fourth fold, the connecting plate abuts against the outside of the fourth fold.

4. The rack column of claim 3, wherein the length of the fourth fold is approximately equal to the connecting plate.

5. The rack column of claim 3, wherein the fourth bent portion further comprises a first supporting plate perpendicularly connected with the connecting plate, one end of the first supporting plate close to the connecting plat is abutted against the outside of the third fold.

6. The rack column of claim 5, wherein the fifth bent portion further comprises a second supporting plate, both ends of the second supporting plate are respectively connected with the first supporting plate and the latch plate.

7. The rack column of claim 6, wherein the first supporting plate and the second supporting plate together define a plurality of securing holes to conveniently assemble other accessories.

8. The rack column of claim 1, wherein the length of the first fold is equal to the length of the latch plate.

9. An electronic device, comprising:
servers; and
a rack column configured to support the servers, comprising:
a first bent portion comprising a first fold;
a second bent portion connected with the first bent portion;
a third bent portion connected with the second bent portion;
a fourth bent portion connected with the third bent portion; and
a fifth bent portion connected with the fourth bent portion, the fifth bent portion comprising a latch plate;
wherein one end of the latch plate extends and bends around the first fold to form a hook, a groove is formed between the latch plate and the hook, the first fold is inserted into the groove and abuts against the latch plate and the hook; the first bent portion further comprises a second fold perpendicularly connected with the first fold, and the second bent portion is connected with the second fold; the second bent portion comprises a positioning plate and a limiting plate connected with one end of the positioning plate, the limiting plate is perpendicularly connected with the second fold; an angle between the positioning plate and the limiting plate is an obtuse angle.

10. The electronic device of claim 9, wherein the third bent portion comprises a third fold and a fourth fold perpendicularly connected with the third fold, the second bent portion further comprises another limiting plate connected with one end of the positioning plate, the third fold is perpendicularly connected with the limiting plate, and the fourth fold is connected with the fourth bent portion.

11. The electronic device of claim 10, wherein the fourth bent portion comprises a connecting plate, one end of the connecting plate is connected with the fourth fold, the connecting plate abuts against the outside of the fourth fold.

12. The electronic device of claim 11, wherein the length of the fourth fold is approximately equal to the connecting plate.

13. The electronic device of claim 11, wherein the fourth bent portion further comprises a first supporting plate perpendicularly connected with the connecting plate, one end of the first supporting plate close to the connecting plat is abutted against the outside of the third fold.

14. The electronic device of claim 13, wherein the fifth bent portion further comprises a second supporting plate, both ends of the second supporting plate are respectively connected with the first supporting plate and the latch plate.

15. The electronic device of claim 14, wherein the first supporting plate and the second supporting plate together define a plurality of securing holes to conveniently lock or assemble other accessories.

16. The electronic device of claim 9, wherein the length of the first fold is equal to the length of the latch plate.

* * * * *